United States Patent
Tagami

(10) Patent No.: US 10,504,915 B2
(45) Date of Patent: Dec. 10, 2019

(54) INTEGRATED CIRCUIT DEVICE HAVING AN AIR GAP BETWEEN INTERCONNECTS AND METHOD FOR MANUFACTURING THE SAME

(71) Applicant: Toshiba Memory Corporation, Minato-ku (JP)

(72) Inventor: Masayoshi Tagami, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 106 days.

(21) Appl. No.: 15/267,934

(22) Filed: Sep. 16, 2016

(65) Prior Publication Data

US 2017/0256485 A1    Sep. 7, 2017

Related U.S. Application Data

(60) Provisional application No. 62/302,840, filed on Mar. 3, 2016.

(51) Int. Cl.
*H01L 27/11582*    (2017.01)
*H01L 23/522*    (2006.01)
(Continued)

(52) U.S. Cl.
CPC .... *H01L 27/11582* (2013.01); *H01L 21/7682* (2013.01); *H01L 23/5222* (2013.01);
(Continued)

(58) Field of Classification Search
CPC ....... H01L 2221/1042; H01L 21/76264; H01L 21/764; H01L 21/76289; H01L 21/7682;
(Continued)

(56) References Cited

U.S. PATENT DOCUMENTS

2006/0088975 A1* 4/2006 Ueda ................ H01L 21/76801
438/421
2011/0216597 A1* 9/2011 Higashi ............ H01L 27/11582
365/185.18

(Continued)

FOREIGN PATENT DOCUMENTS

| JP | 2008-277437 | 11/2008 |
|---|---|---|
| JP | 2012-80133 | 4/2012 |
| JP | 2014-53612 | 3/2014 |

*Primary Examiner* — Changhyun Yi
(74) *Attorney, Agent, or Firm* — Oblon, McClelland, Maier & Neustadt, L.L.P.

(57) ABSTRACT

An integrated circuit device includes a first insulating film, a second insulating film provided on the first insulating film, and having a composition different from a composition of the first insulating film, a first interconnect extending in a first direction crossing a vertical direction, and having a lower portion disposed in the first insulating film, and an upper portion disposed in the second insulating film, and a second interconnect extending in the first direction, and having a lower portion disposed in the first insulating film, and an upper portion disposed in the second insulating film. An air gap is formed in the first insulating film and in the second insulating film and also between the first interconnect and the second interconnect. A lower end of the air gap is located lower than a lower surface of the first interconnect and a lower surface of the second interconnect.

17 Claims, 13 Drawing Sheets

(51) Int. Cl.
*H01L 21/768* (2006.01)
*H01L 23/532* (2006.01)

(52) U.S. Cl.
CPC .... *H01L 23/5226* (2013.01); *H01L 23/53238* (2013.01); *H01L 23/53295* (2013.01)

(58) Field of Classification Search
CPC ............. H01L 23/4821; H01L 29/0649; H01L 21/76801; H01L 23/5226
See application file for complete search history.

(56) References Cited

U.S. PATENT DOCUMENTS

2011/0309517 A1* 12/2011 Miki .................. H01L 21/7682
257/774
2014/0035147 A1* 2/2014 Lee .................... H01L 21/76877
257/762
2014/0061926 A1 3/2014 Han et al.
2015/0333009 A1* 11/2015 Lin .................... H01L 23/53223
257/751

* cited by examiner

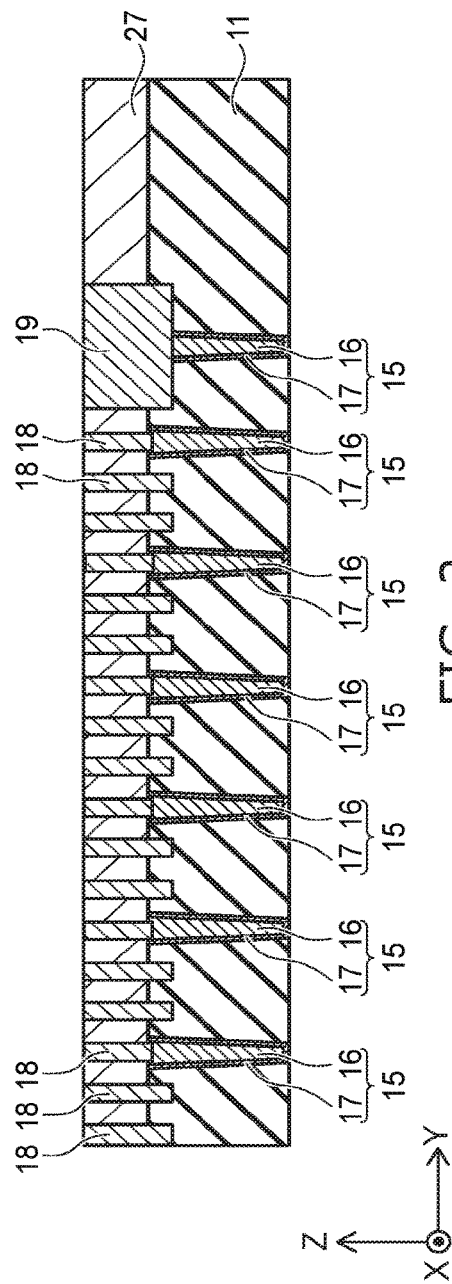
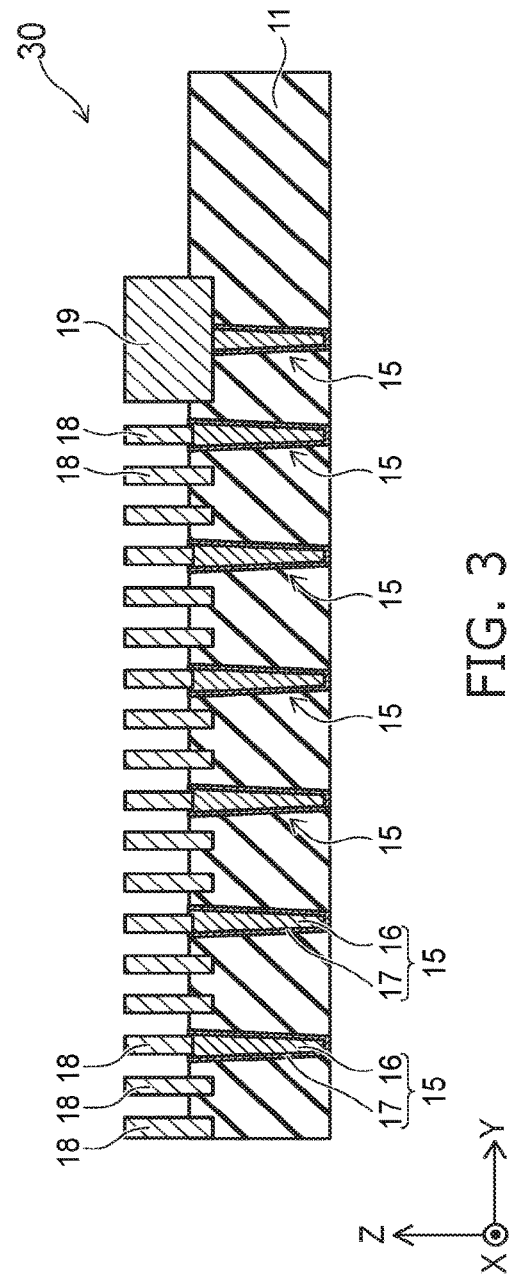
FIG. 2
FIG. 3

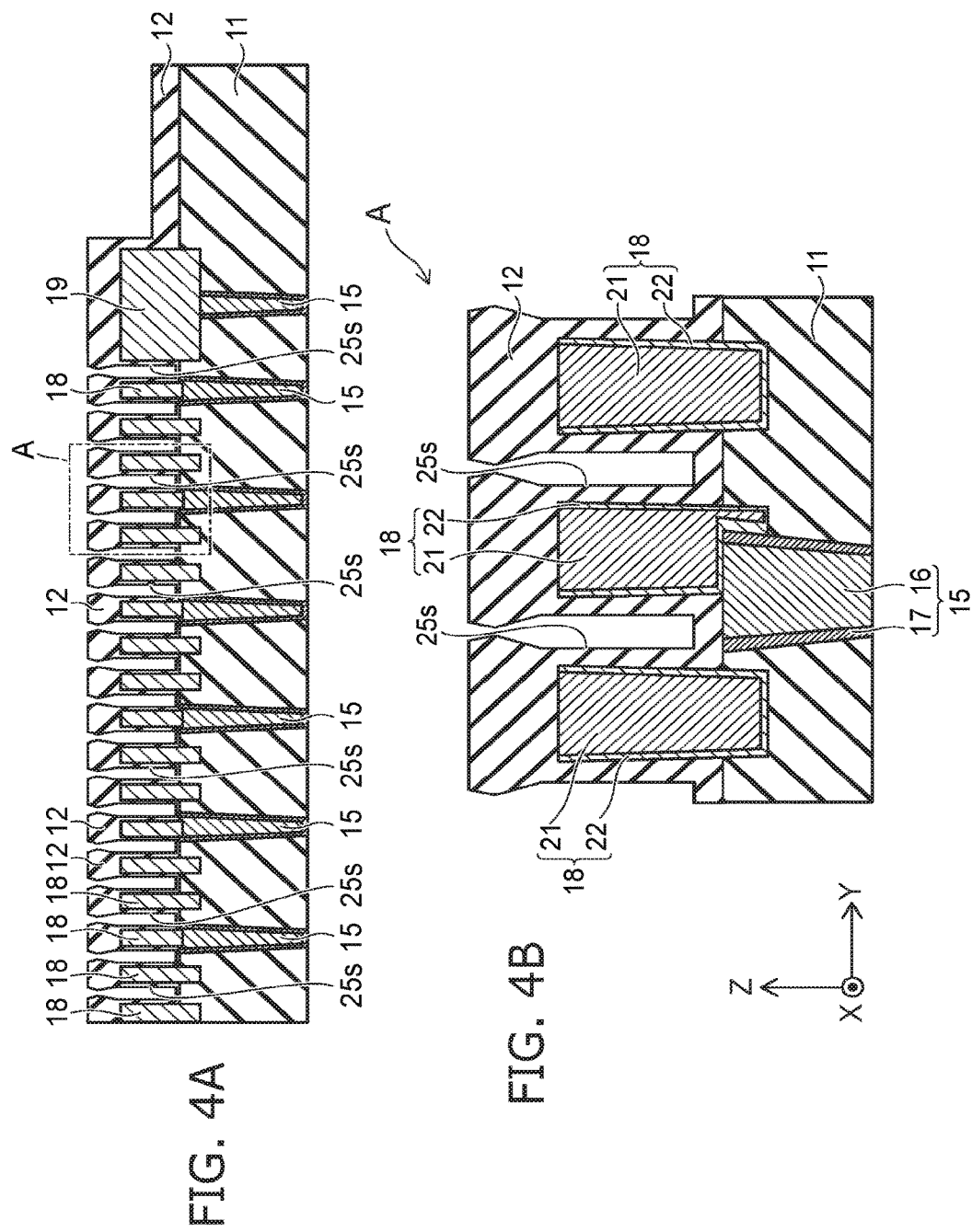

INTEGRATED CIRCUIT DEVICE HAVING AN AIR GAP BETWEEN INTERCONNECTS AND METHOD FOR MANUFACTURING THE SAME

CROSS-REFERENCE TO RELATED APPLICATIONS

This application is based upon and claims the benefit of priority from U.S. Provisional Patent Application 62/302,840, filed on Mar. 3, 2016; the entire contents of which are incorporated herein by reference.

FIELD

Embodiments relate to an integrated circuit device and a method for manufacturing the same.

BACKGROUND

Recently, a stacked type semiconductor memory device in which memory cells are three-dimensionally integrated has been proposed. In such a stacked type semiconductor memory device, a stacked body in which an electrode film and an insulating film are alternately stacked on a semiconductor substrate is provided, and a semiconductor pillar piercing the stacked body is provided. Further, a memory cell is formed at each crossing portion between the electrode film and the semiconductor pillar. On the stacked body, bit lines are provided, and each bit line is connected to the semiconductor pillar through a via.

BRIEF DESCRIPTION OF THE DRAWINGS

FIGS. 2 to 6B are cross-sectional views showing a method for manufacturing an integrated circuit device according to the first embodiment;

DETAILED DESCRIPTION

An integrated circuit device according to one embodiment, includes a first insulating film, a second insulating film provided on the first insulating film, and having a composition different from a composition of the first insulating film, a first interconnect extending in a first direction crossing a vertical direction, and having a lower portion disposed in the first insulating film, and an upper portion disposed in the second insulating film, and a second interconnect extending in the first direction, and having a lower portion disposed in the first insulating film, and an upper portion disposed in the second insulating film. An air gap is formed in the first insulating film and in the second insulating film and also between the first interconnect and the second interconnect. A lower end of the air gap is located lower than a lower surface of the first interconnect and a lower surface of the second interconnect.

A method for manufacturing an integrated circuit device according to one embodiment, includes forming a second insulating film on a base body by depositing a second insulating material. The base body has a first insulating film, which is composed of a first insulating material, a first interconnect, which extends in a first direction, and in which a lower portion is disposed in the first insulating film, and an upper portion protrudes from an upper surface of the first insulating film, and a second interconnect, which extends in the first direction, and in which a lower portion is disposed in the first insulating film, and an upper portion protrudes from an upper surface of the first insulating film. The second insulating material is different from the first insulating material. The second insulating material is deposited so that a space between the first interconnect and the second interconnect is not closed. The method includes locating a lower end of the space lower than a lower surface of the first interconnect and a lower surface of the second interconnect by performing etching under a condition that an etching speed for the first insulating material is higher than an etching speed for the second insulating material. The method includes sealing an upper end of the space by depositing a third insulating material.

(First Embodiment)

First, a first embodiment will be described.

Figure 1:
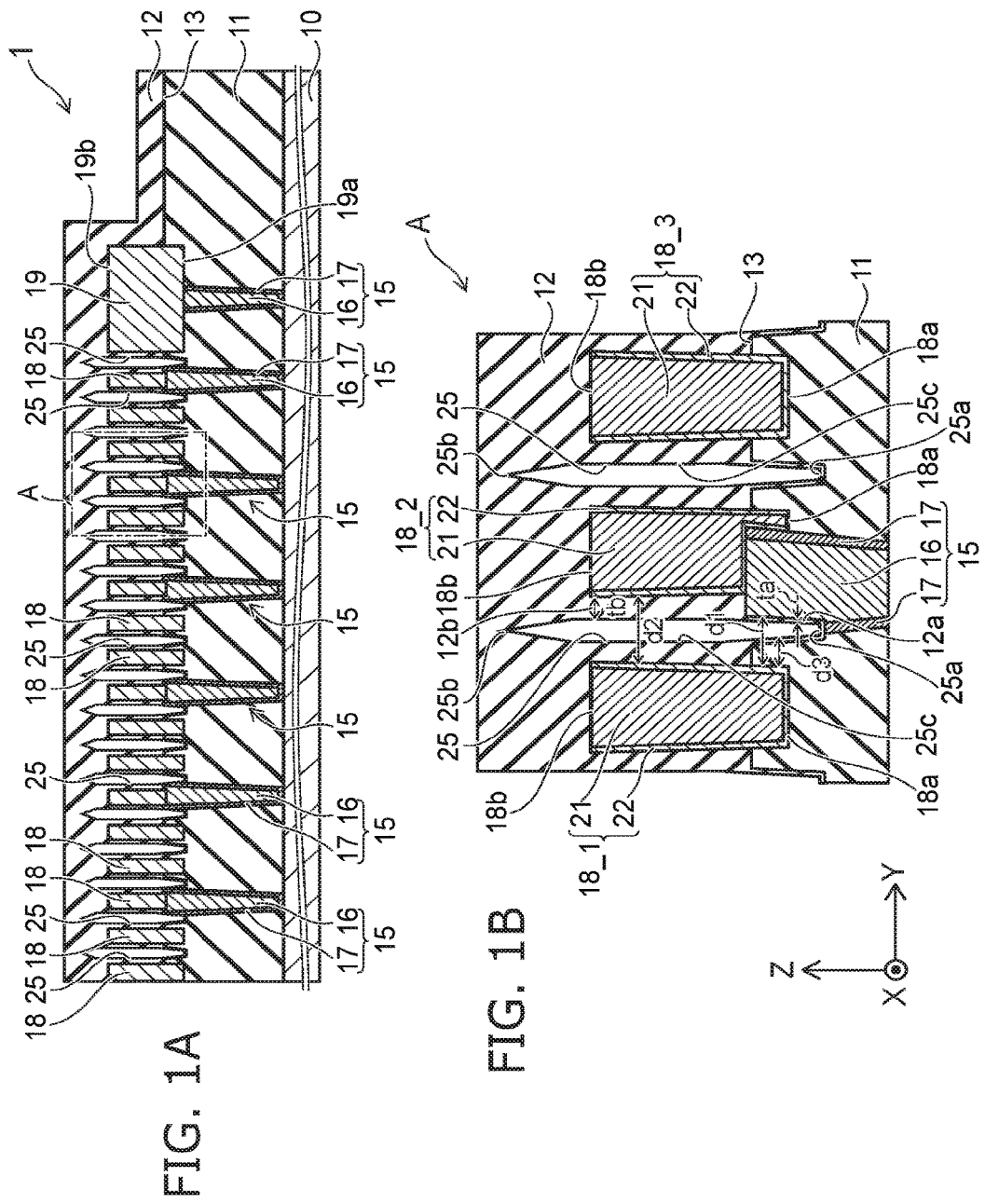
FIG. 1A is a cross-sectional view showing an integrated circuit device according to a first embodiment.
FIG. 1B is a cross-sectional view showing a region A of FIG. 1A.

FIG. 1A is a cross-sectional view showing an integrated circuit device according to the embodiment, and FIG. 1B is a cross-sectional view showing a region A of FIG. 1A.

As shown in FIGS. 1A and 1B, in an integrated circuit device 1 according to the embodiment, an insulating film 11 is provided on a silicon substrate 10. The insulating film 11 is formed of, for example, silicon oxide (SiO). On the insulating film 11, an insulating film 12 is provided. A composition of the insulating film 12 is different from a composition of the insulating film 11 and is, for example, silicon carbonitride (SiCN). The insulating film 12 is in contact with the insulating film 11.

Hereinafter, in the specification, for the sake of convenience of description, an XYZ orthogonal coordinate system is adopted. Two directions parallel to an interface 13 between the insulating film 11 and the insulating film 12 and also orthogonal to each other are referred to as "X-direction" and "Y-direction", and a direction perpendicular to the interface 13 is referred to as "Z-direction". Further, in the specification, for the sake of convenience of description, in the Z-direction, a direction from the insulating film 11 to the insulating film 12 is also referred to as "upper", and a direction opposite thereto is also referred to as "lower". These terms are for reference only, and are irrelevant to the direction of gravity.

In the integrated circuit device 1, a plurality of vias 15 are provided in the insulating film 11. The shape of each via 15 is a substantially circular columnar shape extending in the Z-direction. An upper surface of the via 15 is located at the interface 13. Each via 15 is constituted by a main body portion 16 composed of tungsten (W) and a barrier metal layer 17 provided on a lower surface and on a side surface of the main body portion 16. The barrier metal layer 17 is formed of, for example, titanium (Ti), titanium nitride (TiN), tantalum (Ta), or tantalum nitride (TaN).

In the integrated circuit device 1, a plurality of, for example, three or more interconnects 18 extending in the X-direction are provided. The interconnects 18 are arranged periodically along the Y-direction. On one side of the Y-direction when viewed from the plurality of interconnects 18, one interconnect 19 extending in the X-direction is provided. A width, that is, a length in the Y-direction of the interconnect 19 is wider than a width of the interconnect 18. Lower portions of each interconnect 18 and the interconnect 19 are disposed in the insulating film 11, and upper portions thereof are disposed in the insulating film 12. The interconnect 18 is disposed so as to cross over the via 15, and the interconnect 18 is connected to an upper end of the via 15. Incidentally, in FIGS. 1A and 1B, the interconnect 18 disposed on the via 15 is located on a front side and a back side of the paper surface, that is, at a position overlapping with an upper portion of the via 15 when viewed from the X-direction on both sides in the X-direction of the via 15.

Each interconnect 18 and the interconnect 19 are constituted by a main body portion 21 composed of, for example, copper (Cu) and a barrier metal layer 22 provided on a lower surface and on a side surface of the main body portion 21. The barrier metal layer 22 is formed of, for example, titanium, titanium nitride, tantalum, or tantalum nitride. Incidentally, in FIG. 1A, the vias 15 are partly shown. The rest of the vias 15 are disposed in a YZ cross section which is different from the cross section shown in FIG. 1A, and are not shown in the drawing. For example, each interconnect 18 and the interconnect 19 are connected to each via 15.

In the insulating films 11 and 12, and also between the interconnects 18 adjacent to each other in the Y-direction, and between the interconnect 19 and the interconnect 18 located closest to the interconnect 19, an air gap 25 is formed. The shape of the air gap 25 is a substantially plate shape, and a longest longitudinal direction thereof is the X-direction, a second longest width direction thereof is the Z-direction, and a shortest thickness direction thereof is the Y-direction. An upper portion of the air gap 25 is sealed by the insulating film 12. A lower end 25a of the air gap 25 is located lower than a lower surface 18a of the interconnect 18 and a lower surface 19a of the interconnect 19, and an upper end 25b thereof is located upper than an upper surface 18b of the interconnect 18 and an upper surface 19b of the interconnect 19. Further, an entire inner surface 25c of the air gap 25 is constituted by the insulating film 12.

The via 15 is disposed in a region substantially immediately beneath the interconnect 18 or the interconnect 19, and is connected to the interconnect 18 or the interconnect 19. However, some vias 15 are disposed out of the region immediately beneath the interconnect 18. For example, as shown in FIG. 1B, the via 15 connected to a given interconnect 18_2 is sometimes shifted on a side of an interconnect 18_1 adjacent to the interconnect 18_2. This occurs due to a process error, for example, misalignment of light exposure or the like. In this case, the air gap 25 between the interconnect 18_1 and the interconnect 18_2 is formed such that the via 15 is partially scraped off.

At this time, a distance d1 between the interconnect 18_1 and the via 15 is shorter than a distance d2 between the interconnect 18_1 and the interconnect 18_2. Also in this case, between the air gap 25 and the via 15, part of the insulating film 12 is interposed. However, a portion 12a disposed between the via 15 and the air gap 25 in the insulating film 12 is thinner than a portion 12b disposed between the interconnect 18_2 and the air gap 25 in the insulating film 12. Specifically, when one YZ cross section of the integrated circuit device 1 is observed by an electron microscope or the like, a maximum value of a thickness ta of the portion 12a is smaller than a minimum value of a thickness tb of the portion 12b. Further, the distance d1 between the interconnect 18_1 and the via 15 is longer than a distance d3 between interconnect 18_1 and the air gap 25.

Next, a method for manufacturing an integrated circuit device according to the embodiment will be described.

FIGS. 2 to 6B are cross-sectional views showing the method for manufacturing an integrated circuit device according to the embodiment.

Figures 5A, 5B:
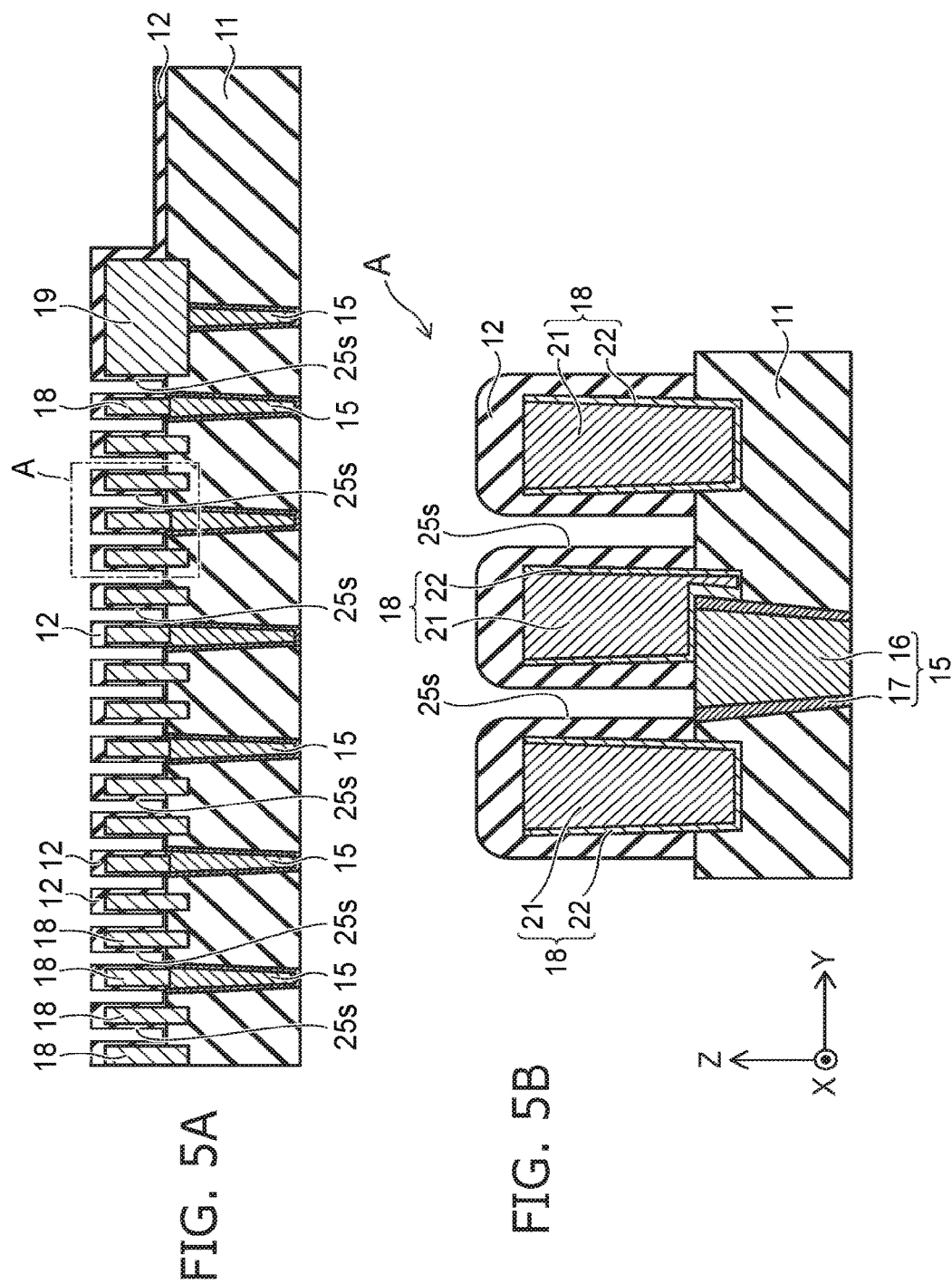

FIG. 4B shows a region A of FIG. 4A. FIG. 5B shows a region A of FIG. 5A. FIG. 6B shows a region A of FIG. 6A.

First, as shown in FIG. 2, an insulating film 11 composed of silicon oxide (SiO) is prepared. Subsequently, by a lithographic method and an RIE (Reactive Ion Etching) method, a via hole is formed in the insulating film 11. Subsequently, a barrier metal layer 17 is formed on an inner surface of the via hole, and further, a main body portion 16 is formed by burying tungsten therein, whereby a via 15 is formed in the insulating film 11.

Subsequently, by a Damascene method, interconnects 18 and 19 are formed. Specifically, on the insulating film 11, a sacrifice film 27 is formed. The sacrifice film 27 is formed of a material having an etching selection ratio between the sacrifice film 27 and the insulating film 11, for example, is formed of amorphous silicon (a-Si) or an organic material. Subsequently, by a lithographic method and an RIE method, a plurality of grooves extending in the X-direction is formed in the sacrifice film 27. At this time, RIE is performed by using the insulating film 11 as a stopper, however, by over etching, a lower portion of the groove penetrates into an upper portion of the insulating film 11. Further, by performing this etching under a condition that an etching speed for the insulating film 11 is higher than an etching speed for the via 15, in the case where the via 15 is interposed in the groove, the groove is formed while avoiding the via 15. Subsequently, a barrier metal layer 22 is formed on an inner surface of the groove, and thereafter, copper is buried in the groove, whereby a main body portion 21 is formed. Subsequently, an upper surface of the sacrifice film 27 is subjected to a flattening treatment such as CMP (Chemical Mechanical Polishing). In this manner, the interconnect 18 and the interconnect 19 are formed in the grooves.

At this time, the interconnect 18 is formed so as to cross over the via 15, however, due to misalignment of light exposure or the like, some interconnects 18 are not entirely disposed in a region immediately beneath the via 15, and a portion of an upper surface of the via 15 sometimes extends out on a Y-direction side from the interconnect 18. In this case, as shown in FIG. 1B, a distance d1 between a given interconnect 18_1 and the via 15 is shorter than a distance d2 between the interconnect 18_1 and an interconnect 18_2.

Subsequently, as shown in FIG. 3, by performing wet etching using, for example, dilute hydrofluoric acid (dHF), the sacrifice film 27 (see FIG. 2) is removed. By doing this, an upper portion of the interconnect 18 and an upper portion of the interconnect 19 protrude from an upper surface of the insulating film 11. In this manner, a base body 30 including the insulating film 11 composed of silicon oxide, and the interconnects 18 and 19, which extend in the X-direction, and in which lower portions are disposed in the insulating film 11 and upper portions protrude from an upper surface of the insulating film 11 is fabricated. A space 25s is formed between the interconnects 18 adjacent to each other, and between the interconnect 19 and the interconnect 18 closest to the interconnect 19.

Subsequently, as shown in FIGS. 4A and 4B, on the base body 30, an insulating material is deposited, whereby an insulating film 12 is formed. As the insulating material, a material having an etching selection ratio between the insulating material and the insulating film 11, for example, silicon carbonitride (SiCN) is used. The insulating material is deposited under a condition that a coverage is decreased so as not to close the space 25s. By doing this, the insulating film 12 is formed on an upper surface of the insulating film 11, on an exposed surface of the via 15, on a side surface and on an upper surface of the interconnect 18, and on a side surface and on an upper surface of the interconnect 19, but is not completely buried in the space 25s. Further, the insulating films 12 project in an upper portion of the space 25s so as to mutually approach, but do not come in contact with each other. Due to this, an upper portion of the space 25s is left open.

Subsequently, as shown in FIGS. 5A and 5B, the insulating film 12 is subjected to anisotropic etching such as RIE. By doing this, a portion disposed on an upper surface of the insulating film 11 and on an upper surface of the via 15 in the insulating film 12 is removed, whereby the insulating film 11 and the via 15 are exposed, and also a portion projecting in an upper portion of the space 25s in the insulating film 12 is removed, whereby an opening in an upper portion of the space 25s is expanded. On the other hand, most of the portion disposed on side surfaces and on upper surfaces of the interconnects 18 and 19 in the insulating film 12 is left.

Figure 6A:
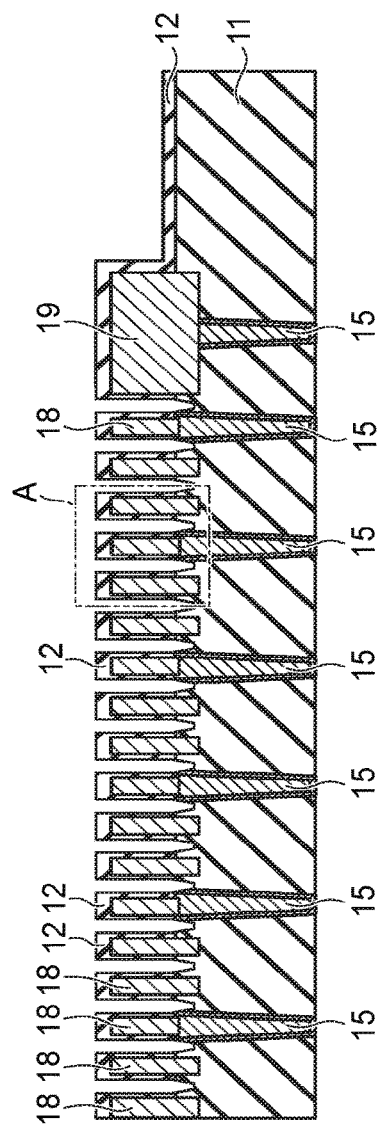
Figure 6B:
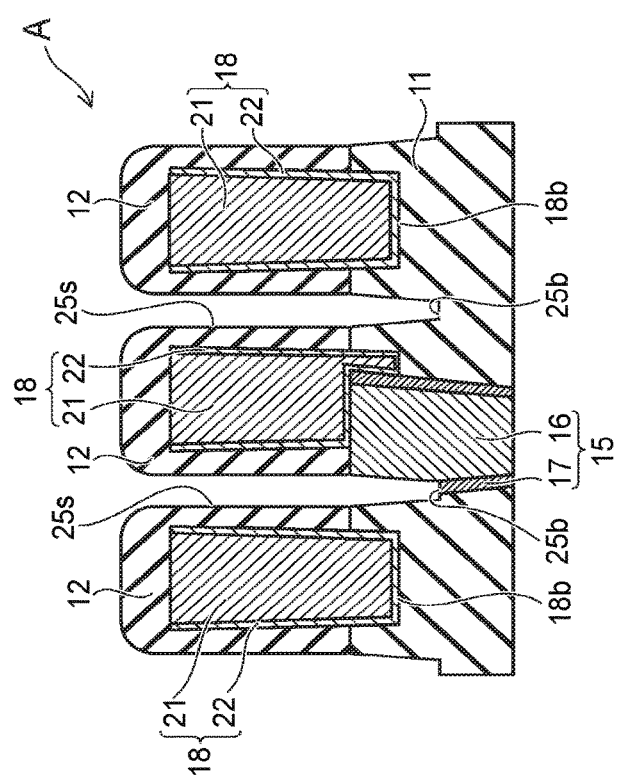

Subsequently, as shown in FIGS. 6A and 6B, anisotropic etching such as RIE is performed under a condition that an etching speed for silicon oxide (SiO) forming the insulating film 11 and tungsten forming the via 15 is higher than an etching speed for silicon carbonitride (SiCN) forming the insulating film 12. By doing this, the insulating film 11 and the via 15 are etched back by using the insulating film 12 as a mask, and the space 25s extends downward without much increasing the width, that is, the length in the Y-direction. As a result, a lower end 25a of the space 25s is located lower than the lower surface 18a of the interconnect 18 and the lower surface 19a of the interconnect 19.

Subsequently, as shown in FIGS. 1A and 1B, silicon carbonitride (SiCN) is deposited. By doing this, in the space 25s, exposed surfaces of the insulating film 11 and the via 15 are covered with a thin insulating film 12, and also an upper end of the space 25s is sealed by the insulating film 12. As a result, in the space 25s, an entire inner surface 25c is constituted by the insulating film 12, and an air gap 25, in which the upper and lower ends are sealed, is formed. At this time, the upper end 25b of the air gap 25 is located upper than the upper surface 18b of the interconnect 18 and the upper surface 19b of the interconnect 19. Incidentally, in this process, in place of silicon carbonitride, another insulating material such as silicon oxide or silicon nitride may be deposited. In this manner, the integrated circuit device 1 according to the embodiment is manufactured.

Next, an effect of the embodiment will be described.

As shown in FIG. 1B, according to the embodiment, by forming the air gap 25 between the interconnects 18 and between the interconnect 18 and the interconnect 19, the capacity between the interconnects 18 and between the interconnect 18 and the interconnect 19 can be reduced. As a result, the time constants of the interconnects 18 and 19 can be reduced, and therefore, the operation speed of the integrated circuit device 1 can be improved.

In particular, in the embodiment, the lower end 25a of the air gap 25 is located lower than the lower surface 18a of the interconnect 18 and the lower surface 19a of the interconnect 19, and the upper end 25b of the air gap 25 is located upper than the upper surface 18b of the interconnect 18 and the upper surface 19b of the interconnect 19. Therefore, the air gap 25 is interposed throughout the entire length of the portion between the interconnects in the Z-direction. As a result, the capacity between the interconnects can be further reduced, and thus, the operation speed can be further improved.

In addition, in the embodiment, the air gap 25 is formed throughout the entire length of the portion between the interconnects 18 in the Z-direction, and therefore, even in the case where metal atoms are diffused from the interconnects 18 in the insulating material between the interconnects 18, a leakage path is not formed between the interconnects 18. As a result, the operational stability of the integrated circuit device 1 is high.

Further, as shown in FIG. 1B, in the case where a given via 15 protrudes on a side of an interconnect 18_1 from a region immediately beneath a given interconnect 18_2, the air gap 25 is formed so as to scrape off the via 15. By doing this, even if the via 15 protrudes on a side of the interconnect 18_1 from a region immediately beneath the interconnect 18_2, a certain fixed distance or more can be ensured between the via 15 and the interconnect 18_1, and thus, a breakdown voltage between the via 15 and the interconnect 18_1 can be ensured.

Further, in the embodiment, by constituting the entire inner surface 25c of the air gap 25 by the insulating film 12, the via 15 made of a metal is never exposed in the air gap 25. Due to this, corrosion of the via 15 in the inner surface of the air gap 25 is suppressed, and thus, the reliability of the integrated circuit device 1 is high.

Still further, in the embodiment, in the process shown in FIGS. 4A and 4B, the insulating film 12 is deposited under a condition that the coverage on the base body 30 is low, and the space 25s, in which the upper portion is open, is formed between the interconnects 18, and thereafter, in the process shown in FIGS. 5A and 5B, the insulating film 12 is etched back, whereby the opening in the upper portion of the space 25s is expanded, and also the insulating film 11 and the via 15 are exposed on the lower surface of the space 25s. By doing this, in the process shown in FIGS. 6A and 6B, the insulating film 11 and the via 15 are etched back by using the insulating film 12 as a mask, whereby the space 25s can be extended downward. Thereafter, in the process shown in FIGS. 1A and 1B, an insulating material is deposited, whereby the upper end of the space 25s is sealed. In this manner, the air gap 25, in which the lower end 25a is located lower than the lower surface 18a of the interconnect 18, and the upper end 25b is located upper than the upper surface 18b of the interconnect 18 can be formed.

Still further, in the embodiment, in the process shown in FIGS. 4A and 4B, the composition of the insulating film 12 and the composition of the insulating film 11 are made different, and therefore, in the process shown in FIGS. 6A and 6B, anisotropic etching can be performed under a condition that the etching speed for the insulating film 11 and the via 15 is higher than the etching speed for the insulating film 12. By doing this, the insulating film 11 and the via 15 can be selectively etched back without much etching back the insulating film 12. Therefore, the space 25s can be extended downward deep.

(Second Embodiment)

Next, a second embodiment will be described.

The embodiment is different from the above-mentioned first embodiment in the method for fabricating the base body 30.

Hereinafter, a method for manufacturing an integrated circuit device according to the embodiment will be described.

Figure 7:
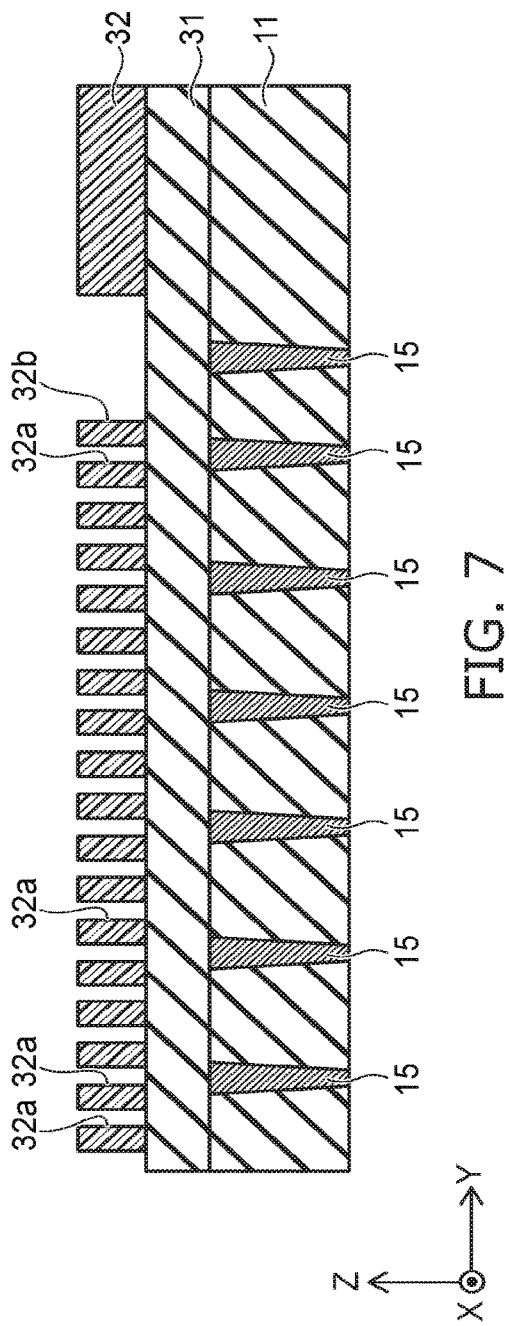
FIGS. 7 to 9 are cross-sectional views showing a method for manufacturing an integrated circuit device according to a second embodiment.
Figure 8:
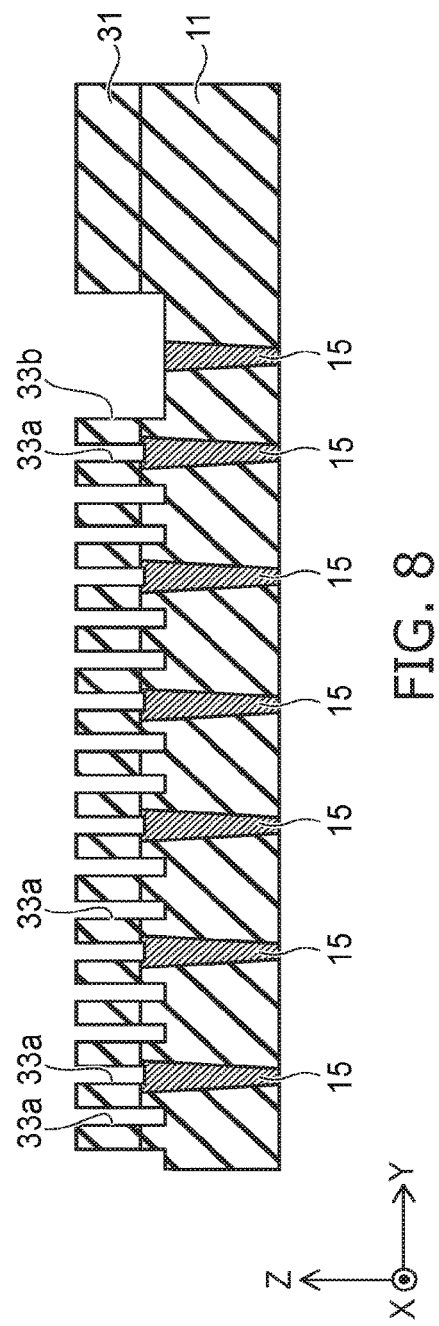
Figure 9:
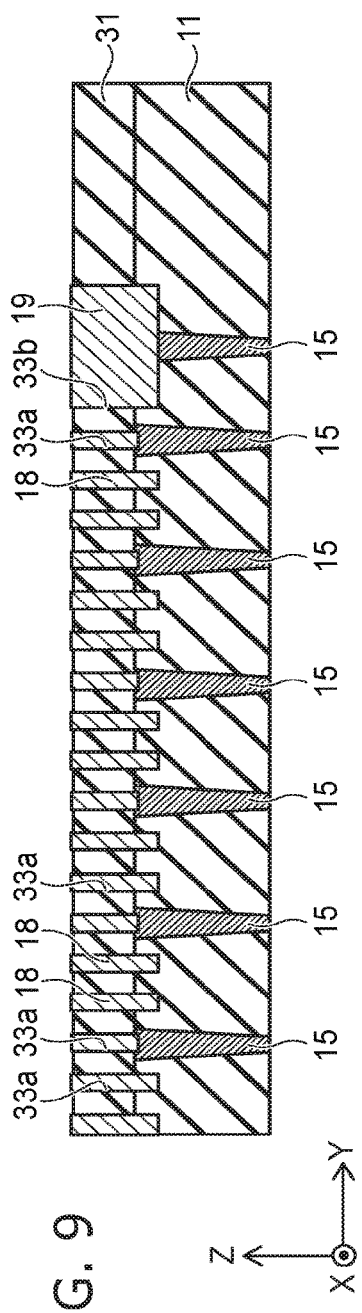

FIGS. 7 to 9 are cross-sectional views showing the method for manufacturing an integrated circuit device according to the embodiment.

As shown in FIG. 7, in the same manner as in the above-mentioned first embodiment, a via 15 is formed in an insulating film 11 composed of silicon oxide. Subsequently, on the insulating film 11, an insulating film 31 composed of silicon oxide is formed. Subsequently, on the insulating film 31, a resist film is formed, followed by light exposure and development, whereby a resist pattern 32 is formed. In the resist pattern 32, an opening portion 32a is formed in a region in which an interconnect 18 is going to be formed, and an opening portion 32b is formed in a region in which an interconnect 19 is going to be formed.

Subsequently, as shown in FIG. 8, the insulating film 31 is subjected to anisotropic etching such as RIE by using the resist pattern 32 as a mask. By doing this, a groove 33a is formed in a region immediately beneath the opening portion 32a of the resist pattern 32, and a groove 33b is formed in a region immediately beneath the opening portion 32b. At this time, in order to reliably expose the via 15 on a bottom surface of the grooves 33a and 33b, over-etching is performed. Due to this, the grooves 33a and 33b penetrate into an upper portion of the insulating film 11.

Subsequently, as shown in FIG. 9, a barrier metal layer 22 (see FIG. 1B) is formed on inner surfaces of the grooves 33a and 33b, and thereafter, copper is buried in the grooves 33a and 33b, whereby main body portions 21 (see FIG. 1B) are formed. Subsequently, an upper surface of the insulating film 31 is subjected to a flattening treatment such as CMP. In this manner, the interconnect 18 and the interconnect 19 are formed in the grooves 33a and 33b, respectively.

Subsequently, the insulating film 31 is removed by etching back. In this manner, a base body 30 shown in FIG. 3 is fabricated. The subsequent method is the same as that of the above-mentioned first embodiment. In addition, the configuration of the integrated circuit device to be fabricated is also the same as that of the above-mentioned first embodiment.

Next, an effect of the embodiment will be described.

According to the embodiment, the base body 30 can be fabricated by forming the insulating film 31 having the same composition as the composition of the insulating film 11 without forming the sacrifice film 27 (see FIG. 2) having a composition different from the composition of the insulating film 11. Due to this, as compared with the first embodiment, the productivity of the integrated circuit device is high.

The other configuration, manufacturing method, and effect of the embodiment are the same as those of the above-mentioned first embodiment.

On the other hand, according to the above-mentioned first embodiment, an etching selection ratio can be realized between the insulating film 11 and the sacrifice film 27, and therefore, in the process shown in FIG. 3, when the sacrifice film 27 is etched back, the position of the upper surface of the insulating film 11 is stabilized. According to this, the shape of the integrated circuit device 1 is stabilized.

(Third Embodiment)

Next, a third embodiment will be described.

Figure 10:
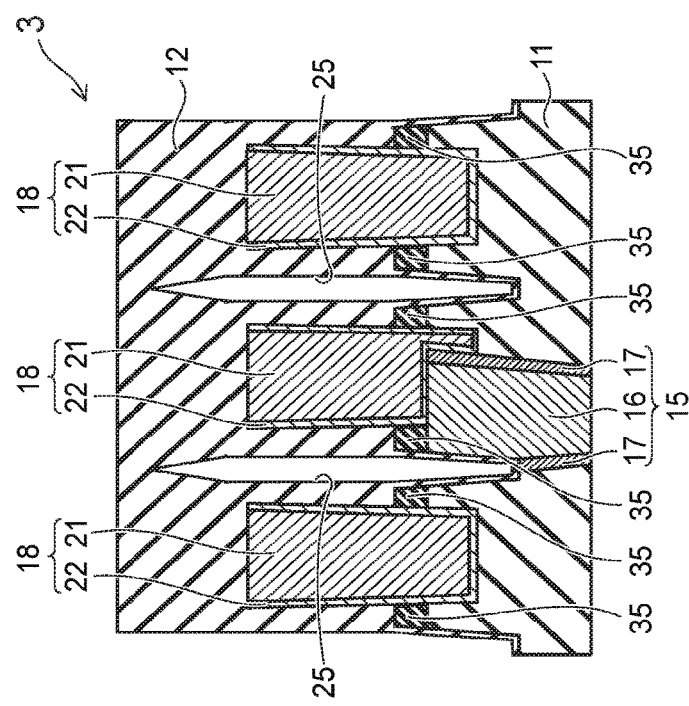
FIG. 10 is a cross-sectional view showing an integrated circuit device according to a third embodiment.

FIG. 10 is a cross-sectional view showing an integrated circuit device according to the embodiment.

As shown in FIG. 10, in an integrated circuit device 3 according to the embodiment, between an insulating film 11 and an insulating film 12, an etching stopper film 35 is provided. The etching stopper film 35 is formed of an insulating material which is different from that of an insulating film 31, for example, silicon nitride (SiN). The etching stopper film 35 is in contact with the insulating film 11, the insulating film 12, an interconnect 18, and an interconnect 19.

Hereinafter, a method for manufacturing an integrated circuit device according to the embodiment will be described.

FIGS. 11 to 14 are cross-sectional views showing the method for manufacturing an integrated circuit device according to the embodiment.

Figure 11:
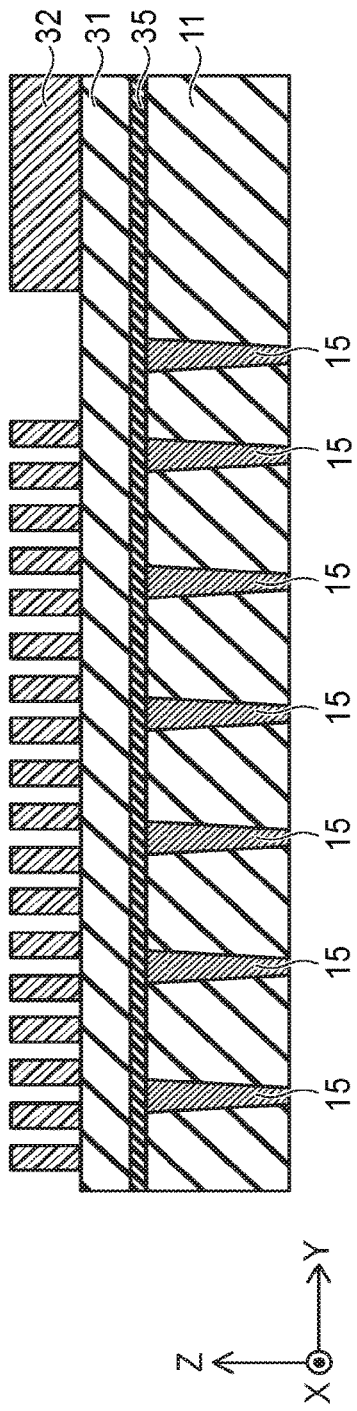
FIGS. 11 to 14 are cross-sectional views showing a method for manufacturing an integrated circuit device according to the third embodiment.

As shown in FIG. 11, in the same manner as in the above-mentioned first embodiment, a via 15 is formed in an insulating film 11 composed of silicon oxide. Subsequently, on the insulating film 11, an etching stopper film 35 composed of silicon nitride is formed. Subsequently, on the etching stopper film 35, an insulating film 31 composed of silicon oxide is formed. Subsequently, on the insulating film 31, a resist film is formed, followed by light exposure and development, whereby a resist pattern 32 is formed.

Figure 12:
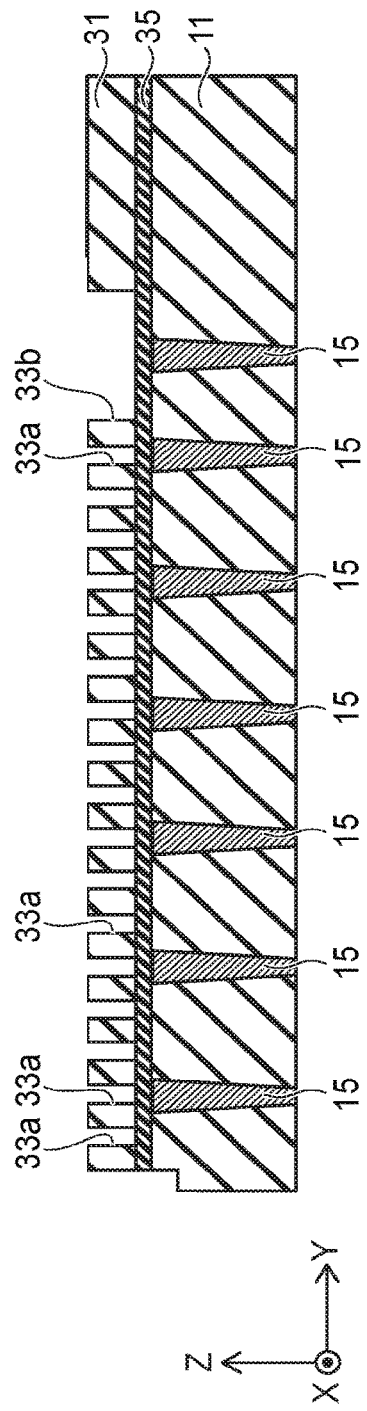

Subsequently, as shown in FIG. 12, the insulating film 31 is subjected to anisotropic etching such as RIE by using the resist pattern 32 as a mask and using the etching stopper film 35 as a stopper. By doing this, grooves 33a and 33b are formed in the insulating film 31. On bottom surfaces of the grooves 33a and 33b, the etching stopper film 35 is exposed.

Figure 13:
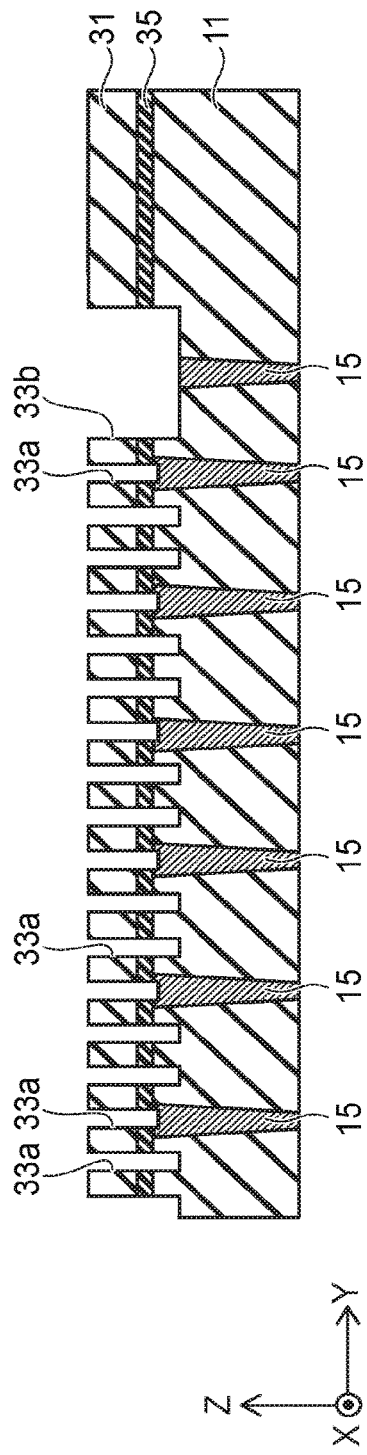

Subsequently, as shown in FIG. 13, the etching stopper film 35 is etched by using the resist pattern 32 as a mask. By doing this, the grooves 33a and 33b pierce the etching stopper film 35 and penetrate in the insulating film 11.

Figure 14:
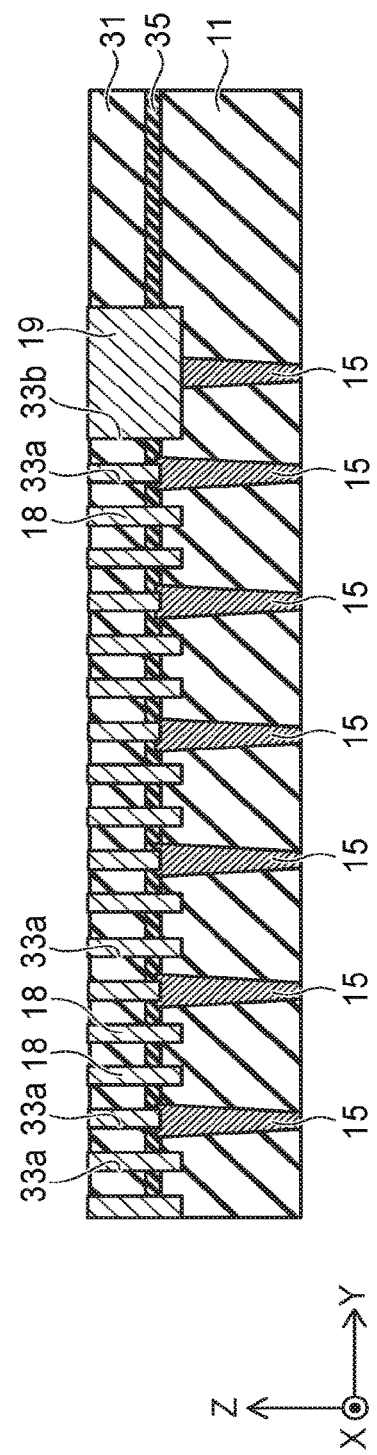

Subsequently, as shown in FIG. 14, in the same manner as in the above-mentioned first embodiment, an interconnect 18 and an interconnect 19 are formed in the grooves 33a and 33b, respectively. Subsequently, the insulating film 31 is removed by etching back. At this time, the etching stopper film 35 is used as a stopper.

Subsequently, the process shown in FIGS. 4A and 4B is performed, whereby an insulating film 12 is formed, and also a space 25s is formed. Subsequently, the process shown in FIGS. 5A and 5B is performed, whereby an opening in an upper portion of the space 25s is expanded, and also the insulating film 11 and the via 15 are exposed by removing the insulating film 12 and the etching stopper film 35 through the space 25s. By doing this, the etching stopper film 35 is divided by the space 25s and a divided surface is exposed.

Subsequently, as shown in FIGS. 6A and 6B, anisotropic etching is performed by using the insulating film 12 as a mask, whereby the insulating film 11 and the via 15 are etched back. Subsequently, silicon carbonitride is deposited on an entire surface, whereby an insulating film 12 is formed thin on an inner surface of the space 25s, and also an upper portion of the space 25s is sealed, whereby an air gap 25 is formed. At this time, the divided surface of the etching stopper film 35 is covered with the insulating film 12. The subsequent method is the same as that of the above-mentioned first embodiment.

Next, an effect of the embodiment will be described.

According to the embodiment, in the process shown in FIG. 11, the etching stopper film 35 is provided on the insulating film 11, and therefore, in the process shown in FIGS. 12 and 13, the depths of the groove 33a and the groove 33b can be made uniform. In addition, when the insulating film 31 is removed, the etching stopper film 35 can be used as a stopper, and therefore, the position of the upper surface of the insulating film 11 can be made uniform. According to this, the processing accuracy is improved.

The other configuration, manufacturing method, and effect of the embodiment are the same as those of the above-mentioned first embodiment.

(Fourth Embodiment)

Next, a fourth embodiment will be described.

The embodiment is an example to which the above-mentioned first embodiment is applied to a stacked type semiconductor memory device.

Figure 15:
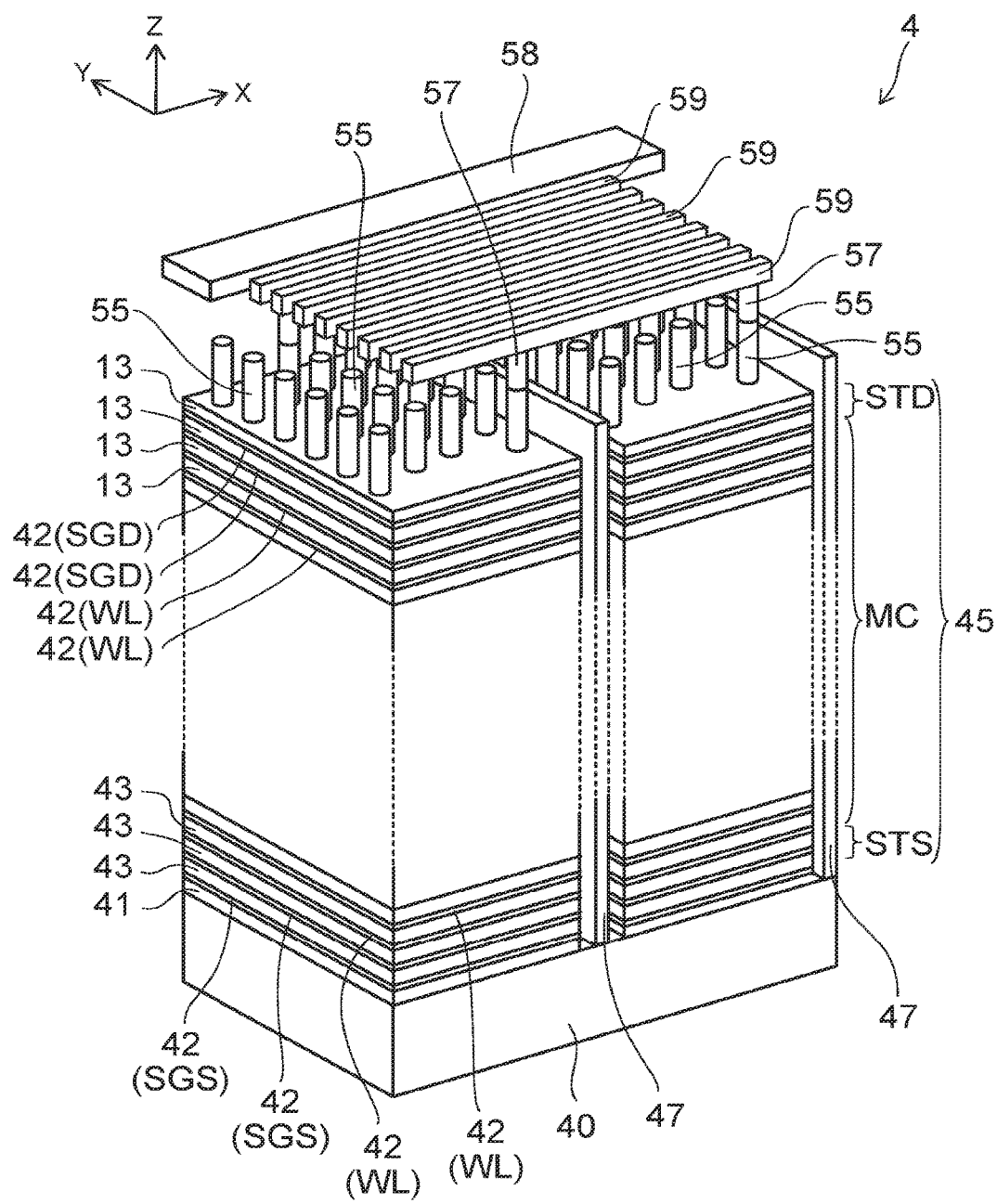
FIG. 15 is a perspective view showing an integrated circuit device according to a fourth embodiment.

FIG. 15 is a perspective view showing an integrated circuit device according to the embodiment.

Figure 16:
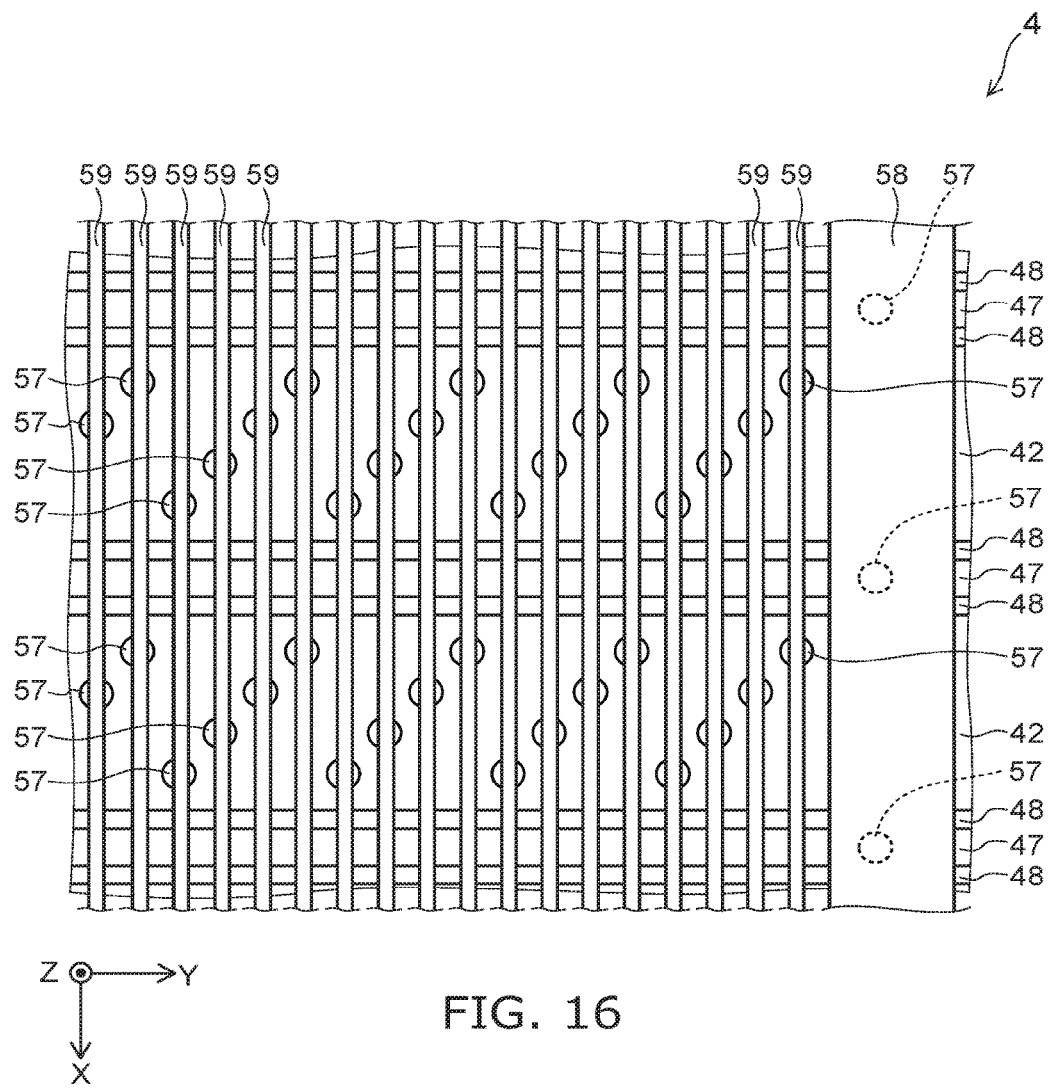
FIG. 16 is a plan view showing the integrated circuit device according to the fourth embodiment.

FIG. 16 is a plan view showing an integrated circuit device according to the embodiment.

Figure 17:
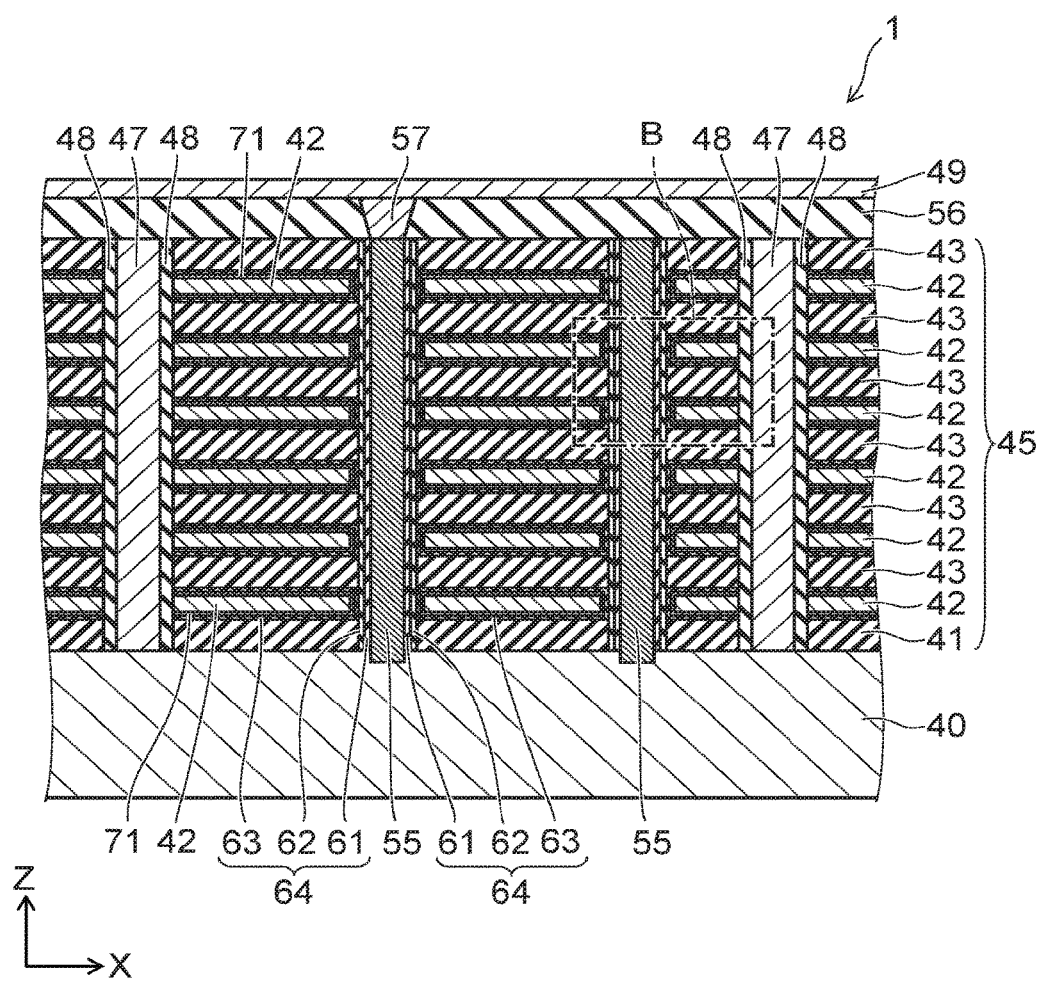
FIG. 17 is a cross-sectional view showing the integrated circuit device according to the fourth embodiment.

FIG. 17 is a cross-sectional view showing an integrated circuit device according to the embodiment.

Figure 18:
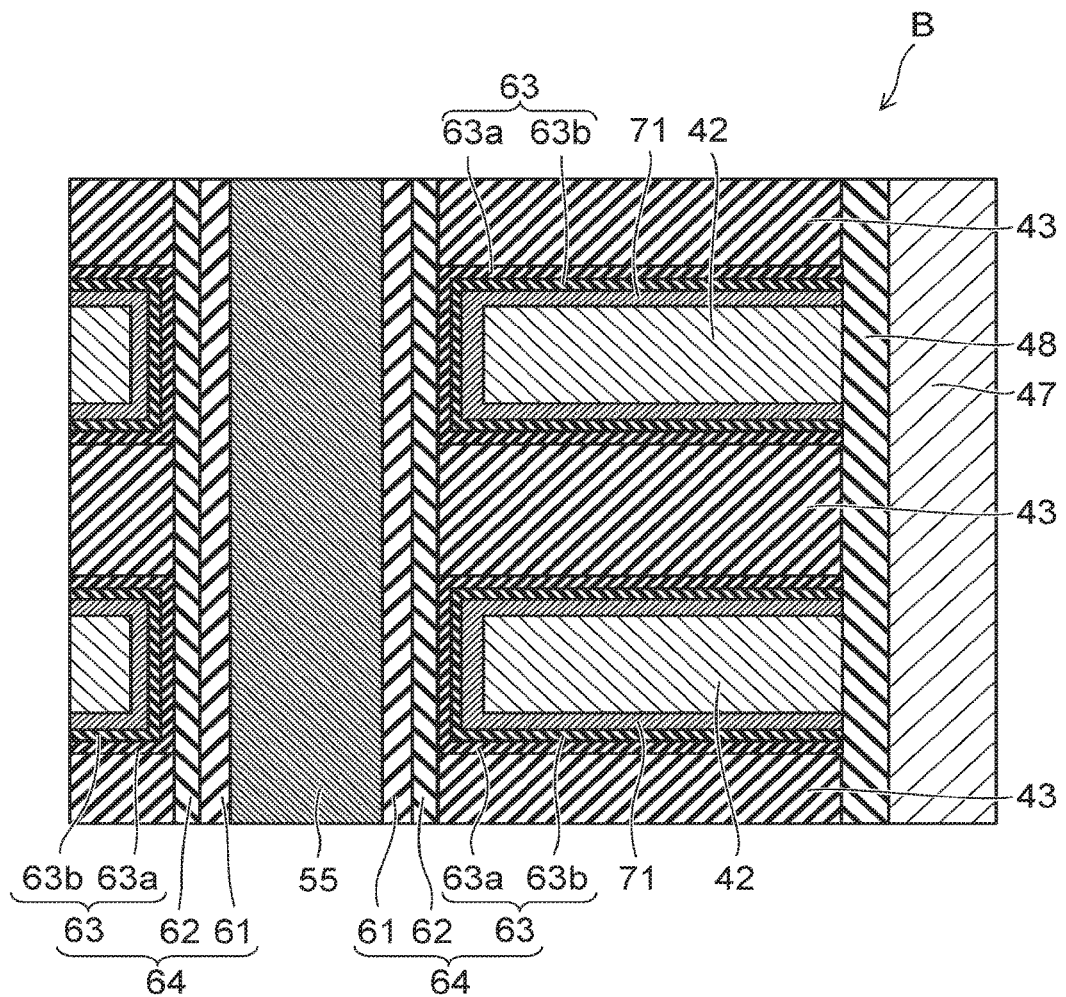
FIG. 18 is a cross-sectional view showing a region B of FIG. 17.

FIG. 18 is a cross-sectional view showing a region B of FIG. 17.

As shown in FIGS. 15 to 17, in an integrated circuit device 4 according to the embodiment, a silicon substrate 40 is provided. On the silicon substrate 40, a stacked body 45 is provided. In the stacked body 45, as a lowermost layer, a silicon oxide film 41 is provided, and on the silicon oxide film 41, an electrode film 42 and a silicon oxide film 43 are alternately stacked. The electrode film 42 is formed of, for example, tungsten.

In the stacked body 45, a plurality of source electrode plates 47 extending in the Y-direction is provided. On a lower end of the source electrode plate 47 is connected to the silicon substrate 40. The shape of the source electrode plate 47 is a plate shape, and a longest longitudinal direction thereof is the Y-direction, a second longest width direction thereof is the Z-direction, and a shortest thickness direction thereof is the X-direction. The source electrode plate 47 is formed of, for example, tungsten (W). On side surfaces facing toward both sides in the X-direction of the source electrode plate 47, a plate-shaped silicon oxide plate 48 is provided.

The shape of an end portion in the Y-direction of the stacked body 45 is a stair shape (not shown) in which a step is formed for each electrode film 42, and the source electrode plate 47 and the silicon oxide plate 48 are terminated within a stair-shaped end portion. Due to this, the shape of the electrode film 42 disposed in an upper portion of the stacked body 45 is a line-and-space shape in which the electrode film 42 is divided by the source electrode plate 47 and the silicon oxide plate 48, and the shape of the electrode film 42 disposed in a lower portion of the stacked body 45 is a comb shape.

In the stacked body 45, a silicon pillar 55 extending in the Z-direction is provided. The silicon pillar 55 is composed of polysilicon and the shape thereof is a circular columnar shape. A lower end of the silicon pillar 55 is connected to the silicon substrate 40, and an upper end thereof is exposed on an upper surface of the stacked body 45. Incidentally, the silicon pillar 55 may have a circular cylindrical shape with a closed lower end portion, or may be provided with a core member composed of, for example, silicon oxide therein. The silicon pillars 55 are periodically arranged along a plurality of rows, for example, four rows when viewed from the Z-direction. Each row extends in the Y-direction, and between the rows adjacent to each other, the positions of the silicon pillars 55 in the Y-direction are shifted by a half period. In the specification, such an arrangement is referred to as "four-row staggered arrangement".

On the stacked body 45, a silicon oxide film 56 is provided, and in the silicon oxide film 56, a via 57 is provided. On the silicon oxide film 56, a source line 58 extending in the X-direction and a plurality of bit lines 59 extending in the X-direction are provided. The source electrode plate 47 is connected to the source line 58 through the via 57. Each silicon pillar 55 is connected to each bit line 59 through each via 57. In this manner, the silicon pillar 55 is connected between the bit line 59 and the silicon substrate 40.

As shown in FIG. 18, on a side surface of the silicon pillar 55, a tunneling insulating film 61 is provided, and on a side surface of the tunneling insulating film 61, a charge storage film 62 is provided. On the other hand, on an upper surface, a lower surface, and on a side surface of the electrode film 42 facing the silicon pillar 55, a barrier metal layer 71, an aluminum oxide layer 63b, and a silicon oxide layer 63a are provided. The aluminum oxide layer 63b and the silicon oxide layer 63a form a block insulating film 63, and the block insulating film 63, the charge storage film 62, and the tunneling insulating film 61 form a memory film 64. The silicon oxide layer 63a is in contact with the charge storage film 62.

In the stacked body 45, the electrode film 42 divided into a line-and-space shape in one step or a plurality of steps from the top functions as an upper selection gate line SGD, and an upper selection gate transistor STD is formed at each crossing portion between the upper selection gate line SGD and the silicon pillar 55. Further, in the electrode film 42 divided into a comb shape, the electrode film 42 in one step or a plurality of steps from the bottom functions as a lower selection gate line SGS, and a lower selection gate transistor STS is formed at each crossing portion between the lower selection gate line SGS and the silicon pillar 55. The electrode film 42 other than the lower selection gate line SGS and the upper selection gate line SGD functions as a word line WL, and a memory cell transistor MC is formed at each crossing portion between the word line WL and the silicon pillar 55. According to this, a plurality of memory cell transistors MC are connected in series along each silicon pillar 55, and to both ends thereof, the lower selection transistor STS and the upper selection transistor STD are connected, whereby an NAND string is formed.

Then, the silicon oxide film 56 in the embodiment corresponds to the insulating film 11 in the above-mentioned first embodiment, the via 57 in the embodiment corresponds to the via 15 in the first embodiment, the source line 58 in the embodiment corresponds to the interconnect 19 in the first embodiment, and the bit line 59 in the embodiment corresponds to the interconnect 18 in the first embodiment. That is, in the integrated circuit device 4, between the bit lines 59, and between the bit line 59 and the source line 58, an air gap 25 (see FIGS. 1A and 1B) is formed.

Next, an effect of the embodiment will be described.

According to the embodiment, by forming the air gap 25 (see FIGS. 1A and 1B) between the bit lines 59, the capacity between the bit lines 59 can be reduced. Due to this, the operation speed of the integrated circuit device 4 can be improved. In particular, by locating the lower end of the air gap 25 lower than the lower surface of the bit line 59, and locating the upper end of the air gap 25 upper than the upper surface of the bit line 59, the bit lines 59 can be more effectively electrically separated from each other, and thus, the operation speed is further improved.

The other configuration, manufacturing method, and effect of the embodiment are the same as those of the above-mentioned first embodiment.

Incidentally, in the embodiment, an example in which the integrated circuit device 4 is a stacked type semiconductor memory device has been shown, however, the invention is not limited thereto. The above-mentioned first to third embodiments can be favorably applied as long as it is an integrated circuit device in which a plurality of interconnects are arranged. For example, the integrated circuit device may be a memory device such as a planar type semiconductor memory device or an ReRAM (Resistance Random Access Memory), or may be MEMS (Micro Electro Mechanical Systems). Further, the above-mentioned second or third embodiment may be applied to the fourth embodiment. According to the embodiments described above, an integrated circuit device which has a high operation speed and a method for manufacturing the same can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An integrated circuit device, comprising:
   a first insulating film;
   a second insulating film provided on the first insulating film, and having a composition different from a composition of the first insulating film;
   a first interconnect extending in a first direction crossing a vertical direction, and having a lower portion disposed in the first insulating film, and an upper portion disposed in the second insulating film;
   a second interconnect extending in the first direction, and having a lower portion disposed in the first insulating film, and an upper portion disposed in the second insulating film; and
   a via provided in the first insulating film, extending in the vertical direction, connected to the second interconnect, a top surface of the via being in contact with the second insulating film, the top surface of the via being located lower than a top surface on the upper portion of the first interconnect and a top surface on the upper portion of the second interconnect, wherein
   an air gap is formed in the first insulating film and in the second insulating film and also between the first interconnect and the second interconnect, and a lower end of the air gap is located lower than a lower surface of the first interconnect and a lower surface of the second interconnect.

2. The device according to claim 1, wherein an upper end of the air gap is located higher than the top surface of the first interconnect and the top surface of the second interconnect.

3. The device according to claim 1, wherein an entire inner surface of the air gap is constituted by the second insulating film.

4. The device according to claim 1, wherein
   a distance between the first interconnect and the via is shorter than a distance between the first interconnect and the second interconnect and longer than a distance between the first interconnect and the air gap, and
   a maximum value of a thickness of a first portion of the second insulating film is smaller than a minimum value of a thickness of a second portion of the second insulating film, the first portion is disposed between the via and the air gap, and the second portion is disposed between the second interconnect and the air gap.

5. The device according to claim 1, further comprising:
   a stacked body in which a plurality of electrode films are mutually separately disposed along the vertical direction;
   a semiconductor pillar extending in the vertical direction and piercing the stacked body; and
   a charge storage film provided between one of the plurality of electrode films and the semiconductor pillar, wherein
   the first insulating film is disposed on the stacked body, and
   the via is connected to the semiconductor pillar.

6. The device according to claim 1, further comprising:
   a third interconnect extending in the first direction, and having a lower portion disposed in the first insulating film, and an upper portion disposed in the second insulating film, wherein
   the second interconnect is disposed between the first interconnect and the third interconnect, and
   an air gap is formed in the first insulating film and in the second insulating film, and also between the second interconnect and the third interconnect, and a lower end of the air gap formed between the second interconnect and the third interconnect is located lower than a lower surface of the second interconnect and a lower surface of the third interconnect.

7. The device according to claim 1, wherein the second insulating film is in contact with the first insulating film.

8. The device according to claim 1, further comprising:
   a third insulating film being in contact with the first interconnect, the first insulating film, and the second insulating film, being disposed between the first insulating film and the first interconnect, and having a composition different from a composition of the first insulating film.

9. The device according to claim 8, wherein the first insulating film contains silicon and oxygen, the second insulating film contains silicon, carbon and nitrogen, and the third insulating film contains silicon and nitrogen.

10. The device according to claim 1, wherein the first insulating film contains silicon and oxygen, and the second insulating film contains silicon, carbon and nitrogen.

11. The device according to claim 1, wherein the first interconnect and the second interconnect contain copper.

12. The device according to claim 1, wherein the top surface of the via is located higher than a lower end of the second interconnect.

13. The device according to claim 1, wherein the via includes a main body and a barrier metal layer, the barrier metal layer being provided on a lower surface and a side surface of the main body.

14. An integrated circuit device, comprising:
    a substrate;
    a first insulating film provided on the substrate;
    a plurality of vias provided in the first insulating film and extending in a vertical direction;
    a second insulating film provided on the first insulating film, and having a composition different from a composition of the first insulating film; and
    a plurality of interconnects extending in a first direction crossing the vertical direction, one of the plurality of interconnects being connected to one of the plurality of vias and the one of the plurality of interconnects having a lower portion disposed in the first insulating film, and an upper portion of the one of the plurality of interconnects disposed in the second insulating film, wherein an air gap is formed in the first insulating film and in the second insulating film, and also between two of the plurality of interconnects adjacent to each other, and a lower end of the air gap is located lower than lower surfaces of the two of plurality of interconnects, and top surfaces of the plurality of vias are in contact with the second insulating film and are located lower than top surfaces on upper portions of the plurality of interconnects, the upper portions of the plurality of interconnects including the upper portion of the one of the plurality of interconnects.

15. The device according to claim 14, wherein an upper end of the air gap is located higher than two of the top surfaces of the two of the plurality of interconnects.

16. The device according to claim 14, further comprising:
a stacked body in which a plurality of electrode films are mutually separately disposed along the vertical direction;
a plurality of semiconductor pillars extending in the vertical direction and piercing the stacked body; and
a charge storage film provided between one of the plurality of electrode films and one of the plurality of semiconductor pillars, wherein
the first insulating film is disposed on the stacked body, and
each of the plurality of vias is connected to each of the plurality of semiconductor pillars.

17. The device according to claim 14, wherein one of the top surfaces one of the plurality of vias is located higher than a lower end of one of the plurality of interconnects, the one of the plurality of interconnects is connected to the one of the plurality of vias.

* * * * *